United States Patent
Xue et al.

(10) Patent No.: US 9,349,946 B2
(45) Date of Patent: *May 24, 2016

(54) METHOD FOR GENERATING QUANTIZED ANOMALOUS HALL EFFECT

(71) Applicants: Tsinghua University, Beijing (CN); Institute of Physics, Chinese Academy of Sciences, Beijing (CN)

(72) Inventors: Qi-Kun Xue, Beijing (CN); Ke He, Beijing (CN); Xu-Cun Ma, Beijing (CN); Xi Chen, Beijing (CN); Li-Li Wang, Beijing (CN); Ya-Yu Wang, Beijing (CN); Li Lv, Beijing (CN); Cui-Zu Chang, Beijing (CN); Xiao Feng, Beijing (CN)

(73) Assignees: Tsinghua University, Beijing (CN); Institute of Physics, Chinese Academy of Sciences, Beijing (CN)

(*) Notice: Subject to any disclaimer, the term of this patent is extended or adjusted under 35 U.S.C. 154(b) by 258 days.

This patent is subject to a terminal disclaimer.

(21) Appl. No.: 14/055,846

(22) Filed: Oct. 16, 2013

(65) Prior Publication Data

US 2014/0179026 A1    Jun. 26, 2014

(30) Foreign Application Priority Data

Dec. 21, 2012  (CN) .......................... 2012 1 05595226

(51) Int. Cl.
*H01L 21/00*    (2006.01)
*H01L 43/14*    (2006.01)
*H01L 43/06*    (2006.01)

(52) U.S. Cl.
CPC .............. *H01L 43/14* (2013.01); *H01L 43/065* (2013.01)

(58) Field of Classification Search
None
See application file for complete search history.

(56) References Cited

U.S. PATENT DOCUMENTS

| 9,018,617 | B2* | 4/2015 | Xue et al. ........................... 257/9 |
| 2012/0138887 | A1* | 6/2012 | Zhang et al. ...................... 257/9 |

OTHER PUBLICATIONS

Bin Li et al., Carrier dependent ferromagnetism in chromium doped topological insulator Cr0.2BixSb1.8-xTe3, URL:http://arxiv.org/abs/1207.4363, p. 1-5, Jul. 19, 2014.
K. V. Klitzing et al., New Method for High-Accuracy Determination of the Fine-Structure Constant Based on Quantized Hall Resistance, Physical Review Letters, Aug. 11, 1980, vol. 45, No. 6, p. 494-497.

(Continued)

*Primary Examiner* — Evan Pert
*Assistant Examiner* — Shaka White
(74) *Attorney, Agent, or Firm* — Novak Druce Connolly Bove + Quigg LLP

(57) ABSTRACT

A method for generating quantum anomalous Hall effect is provided. A topological insulator quantum well film in 3QL to 5QL is formed on an insulating substrate. The topological insulator quantum well film is doped with a first element and a second element to form the magnetically doped topological insulator quantum well film. The doping of the first element and the second element respectively introduce hole type charge carriers and electron type charge carriers in the magnetically doped topological insulator quantum well film, to decrease the carrier density of the magnetically doped topological insulator quantum well film to be smaller than or equal to $1\times10^{13}$ cm$^{-2}$. One of the first element and the second element magnetically dopes the topological insulator quantum well film. An electric field is applied to the magnetically doped topological insulator quantum well film to decrease the carrier density.

10 Claims, 20 Drawing Sheets

(56) References Cited

OTHER PUBLICATIONS

D. C. Tsui et al., Two-Dimensional Magnetotransport in the Extreme Quantum Limit, Physical Review Letters, May 31, 1982, vol. 48, No. 22, p. 1559-1562.
Rui Yu et al., Quantized Anomalous Hall Effect in Magnetic Topological Insulators, Science, vol. 329, Jul. 2, 2010, p. 61-64.
B. Andrei Bernevig et al., Quantum Spin Hall Effect and Topological Phase Transition in HgTe Quantum Wells, Science, Dec. 15, 2006, vol. 314, p. 1757-1761.
Markus Konig et al., Quantum Spin Hall Insulator State in HgTe Quantum Wells, Science, Nov. 2, 2007, vol. 318, p. 766-770.

* cited by examiner

METHOD FOR GENERATING QUANTIZED ANOMALOUS HALL EFFECT

RELATED APPLICATIONS

This application claims all benefits accruing under 35 U.S.C. §119 from China Patent Application No. 201210559522.6, filed on Dec. 21, 2012 in the China Intellectual Property Office, the disclosure of which is incorporated herein by reference. This application is related to commonly-assigned applications entitled, "TOPOLOGICAL INSULATOR STRUCTURE," filed on Oct. 16, 2013, Ser. No. 14/055,863; "ELECTRICAL DEVICE," filed on Oct. 16, 2013, Ser. No. 14/055,860; "METHOD FOR MAKING TOPOLOGICAL INSULATOR STRUCTURE," filed on Oct. 16, 2013, Ser. No. 14/055,853; and "TOPOLOGICAL INSULATOR STRUCTURE," filed on Oct. 16, 2013, Ser. No. 14/055,872.

BACKGROUND

1. Technical Field

The present disclosure relates to a method for generating quantum anomalous Hall effect.

2. Discussion of Related Art

If an electric current flows through an electrical conductor in a magnetic field perpendicular to the electric current, a measurable voltage difference between two sides of the electrical conductor, transverses to the electric current and the magnetic field, will be produced. The presence of this measurable voltage difference is called the Hall effect (HE) discovered by E. H. Hall in 1879. Subsequently, the anomalous Hall effect (AHE) in magnetic materials and the spin Hall effect (SHE) in semiconductors were discovered. Theoretically, HE, AHE, and SHE would have corresponding quantized forms. In 1980, K. V. Klitzing et al. achieved quantum Hall effect (QHE) in a semiconductor in a strong magnetic field at a low temperature (Klitzing K. V. et al., New Method for High-Accuracy Determination of the Fine-Structure Constant Based on Quantized Hall Resistance, Phys Rev Lett, 1980, 45:494-497). After that, D. C. Tsui et al. achieved fractional quantum Hall effect (FQHE) during the studying of the HE in a stronger magnetic field (Tsui D. C. et al., Two-Dimensional Magnetotransport in the Extreme Quantum Limit. Phys Rev Lett, 1982, 48:1559-1562). In 2006, Shoucheng Zhang predicted that quantum spin Hall effect (QSHE) can be realized in mercury telluride-cadmium telluride semiconductor quantum wells (Bernevig B. A. et al., Quantum spin Hall effect and topological phase transition in HgTe quantum wells, Science, 2006, 314:1757-1761). This prediction was confirmed in 2007 (Konig M. et al. Qauntum spin Hall insulator state in HgTe quantum wells. Science, 2007, 318:766-770). At present, in the variety of quantized forms of the HE, only the quantum anomalous Hall effect (QAHE) has not been observed in reality. QAHE is the QHE in zero magnetic field without Landau levels, which can have a Hall resistance of $h/e^2$ (i.e., 25.8 k$\Omega$, i.e., quantum resistance), wherein e is the charge of an electron and h is Planck's constant. The realizing of the QAHE can get rid of the requirement for the external magnetic field and the high electron mobility of the sample, and has an application potential in real devices.

Topological insulators (TIs) are a class of new concept quantum materials. A TI has its bulk band gapped at Fermi level, the same as usual insulators, but hosts gapless, Dirac-type, and spin-split surface states at all of its surfaces, which allow the surfaces to be electrically conductive and are protected by time reversal symmetry (TRS). There are two kinds of TIs, three-dimensional (3D) TIs and two-dimensional (2D) TIs. 3D TIs have topologically-protected two dimensional surface states. 2D TIs have topologically-protected one dimensional edge states. The discovery of $Bi_2Se_3$ group (including $Bi_2Se_3$, $Bi_2Te_3$, and $Sb_2Te_3$) of TIs makes this kind of material receives substantial research interest from not only condensed matter physics but also material science. In 2010, Yu R. et al. predicted that QAHE could be achieved in Cr or Fe doped $Bi_2Se_3$, $Bi_2Te_3$, and $Sb_2Te_3$ 3D TI films (Yu R. et al., Quantized anomalous Hall effect in magnetic topological insulators, Science, 2010, 329:61-64). However, any TI which can observe the QAHE therein has not been achieved. Further, even a ferromagnetic material (including magnetic doped TIs) having an anomalous Hall resistance larger than a kiloohm (k$\Omega$) has not been achieved. For a film having a thickness of 5 nanometers and having the anomalous Hall resistance larger than a kiloohm, the corresponding anomalous Hall resistivity should be larger than or equal to 0.5 milliohms·millimeter (m$\Omega$·mm).

What is needed, therefore, is to provide a method for generating quantum anomalous Hall effect.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

Figure 6:
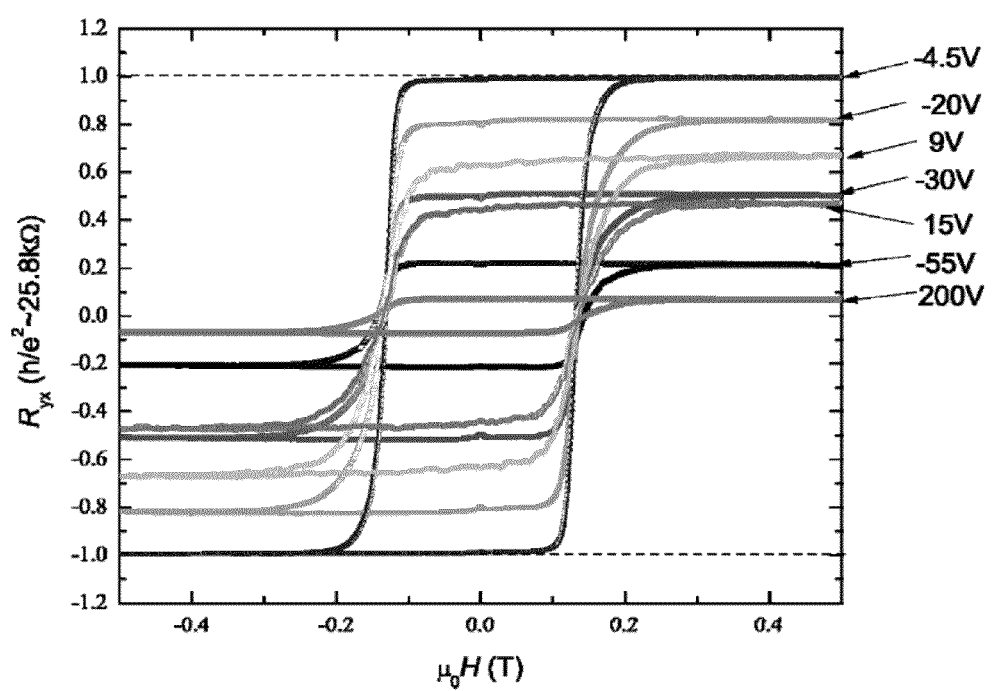
FIG. 6 is a graph showing magnetic field ($\mu_0 H$) dependent Hall resistances ($R_{yx}$) of one embodiment of magnetically doped TI quantum well film at different back gate voltages ($V_b$), wherein a unit of $R_{yx}$ is quantum resistance $h/e^2$, which is 25.8 k$\Omega$.
Figure 7:
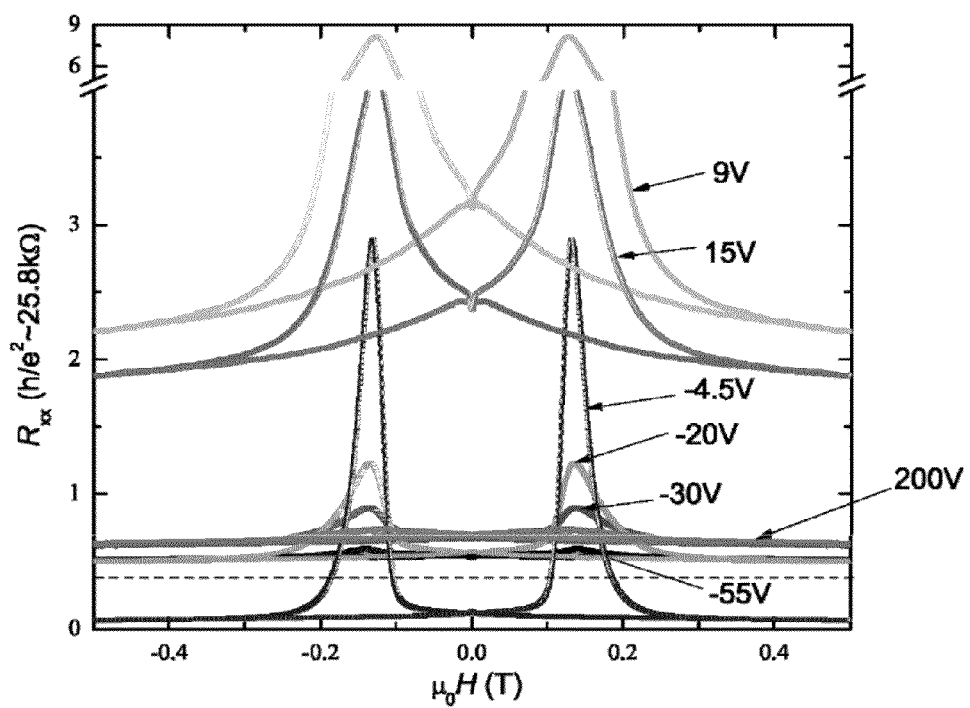
FIG. 7 is a graph showing magnetic field ($\mu_0 H$) dependent longitudinal resistances ($R_{xx}$) of the embodiment of FIG. 6 at different back gate voltages ($V_b$), wherein a unit of $R_{xx}$ is quantum resistance $h/e^2$, which is 25.8 k$\Omega$.
Figure 8:
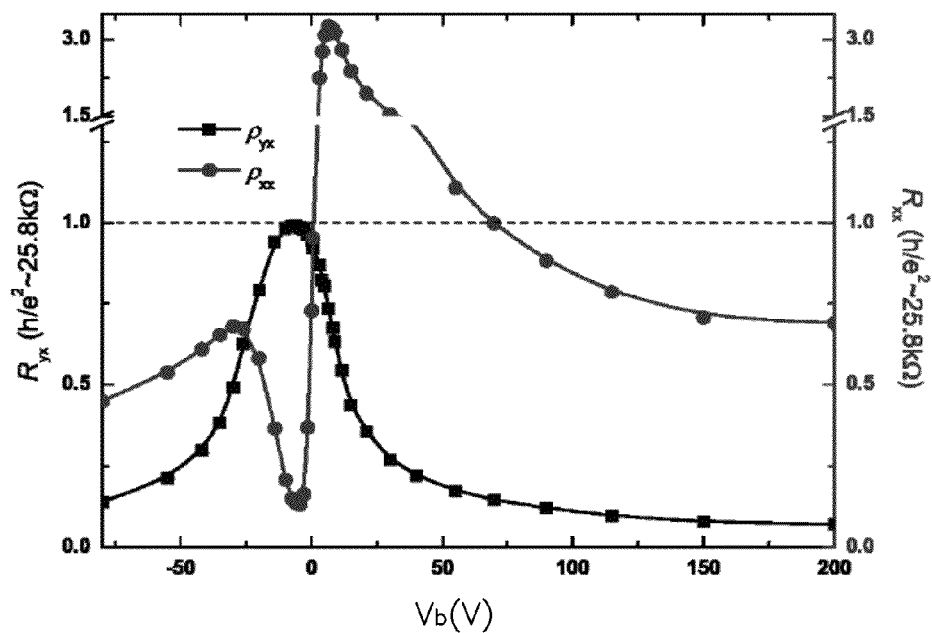
FIG. 8 is a graph showing dependences of $R_{yx}$ and $R_{xx}$ on different back gate voltages ($V_b$) of the embodiment of FIG. 6, wherein units of $R_{yx}$ and $R_{xx}$ are both quantum resistance ($h/e^2$, i.e., 25.8 k$\Omega$).
Figure 9:
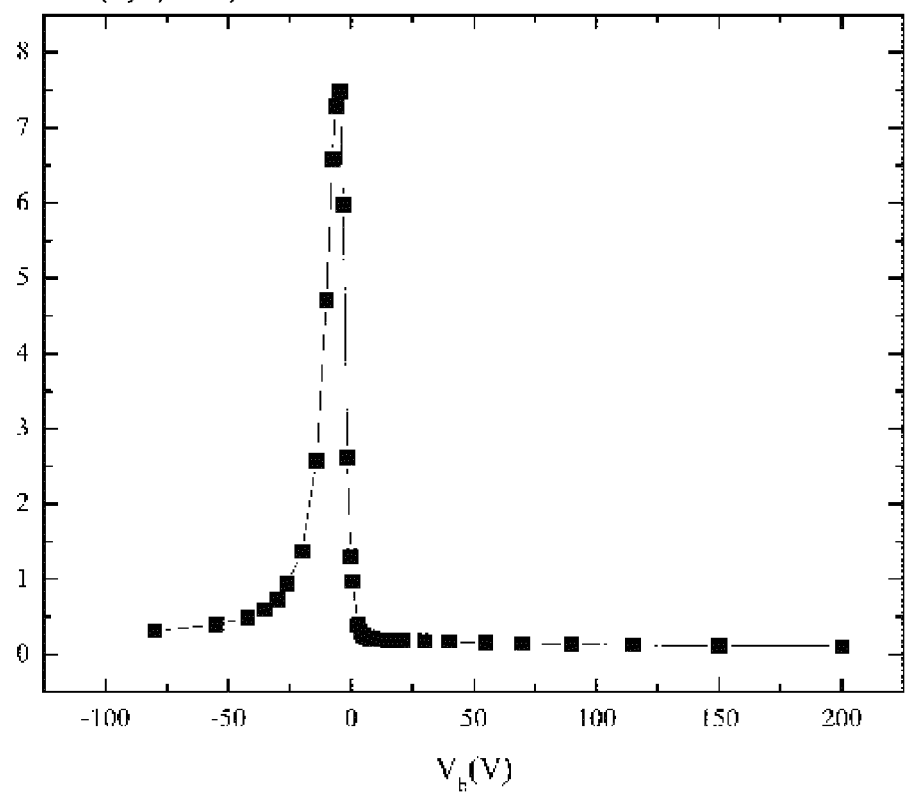
FIG. 9 is a graph showing a dependence of arctangent of Hall angle $$\alpha = \frac{R_{yx}}{R_{xx}}$$

on different back gate voltages ($V_b$) of the embodiment of FIG. 6.

Figure 10:
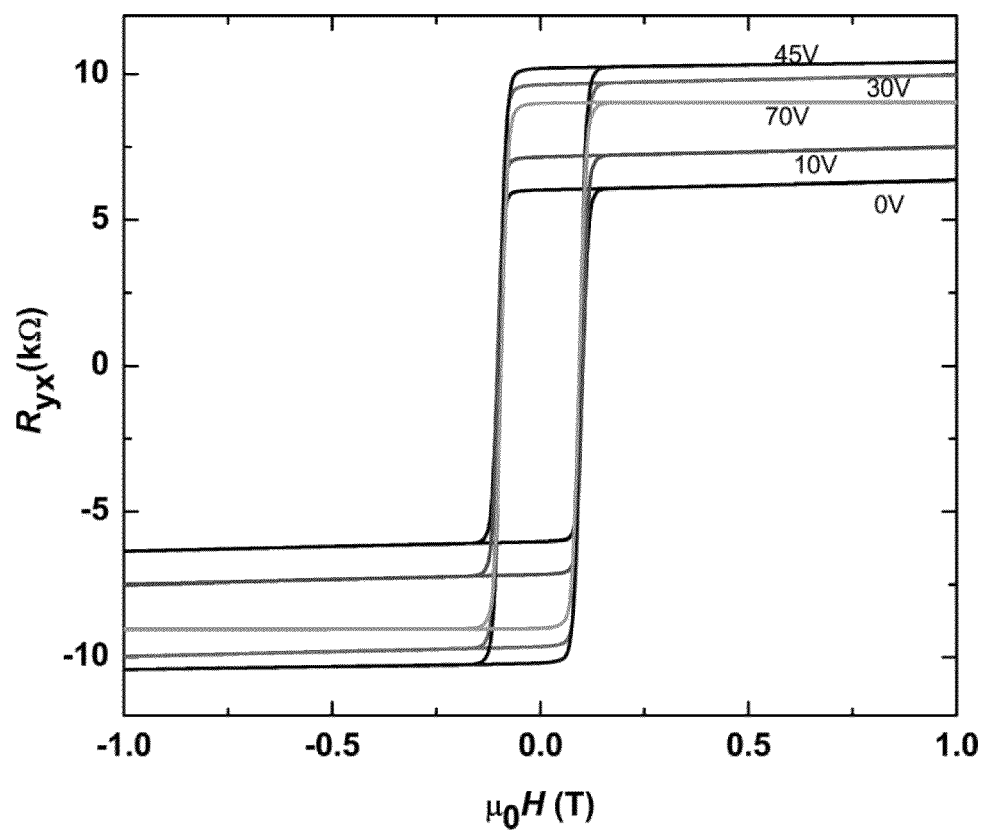

FIG. 10 is a graph showing magnetic field ($\mu_0 H$) dependent Hall resistances ($R_{yx}$) of another embodiment of magnetically doped TI quantum well film at different back gate voltages ($V_b$), wherein the unit of $R_{yx}$ is kΩ.

Figure 11:
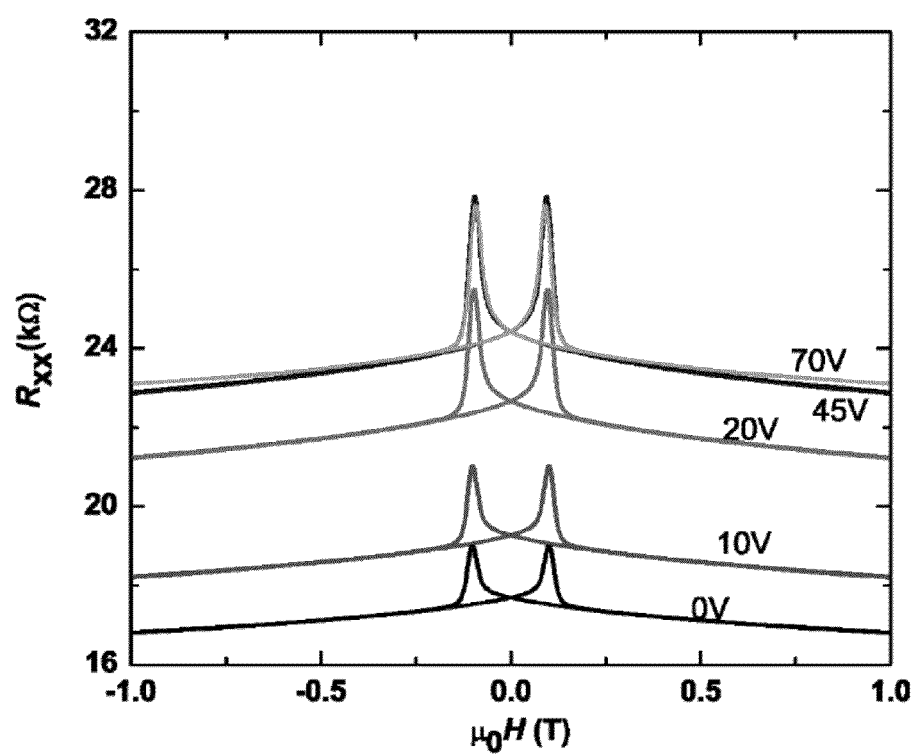

FIG. 11 is a graph showing magnetic field dependent longitudinal resistances ($R_{xx}$) of the embodiment of FIG. 10 at different back gate voltages ($V_b$), wherein the unit of $R_{xx}$ is kΩ.

Figure 12:
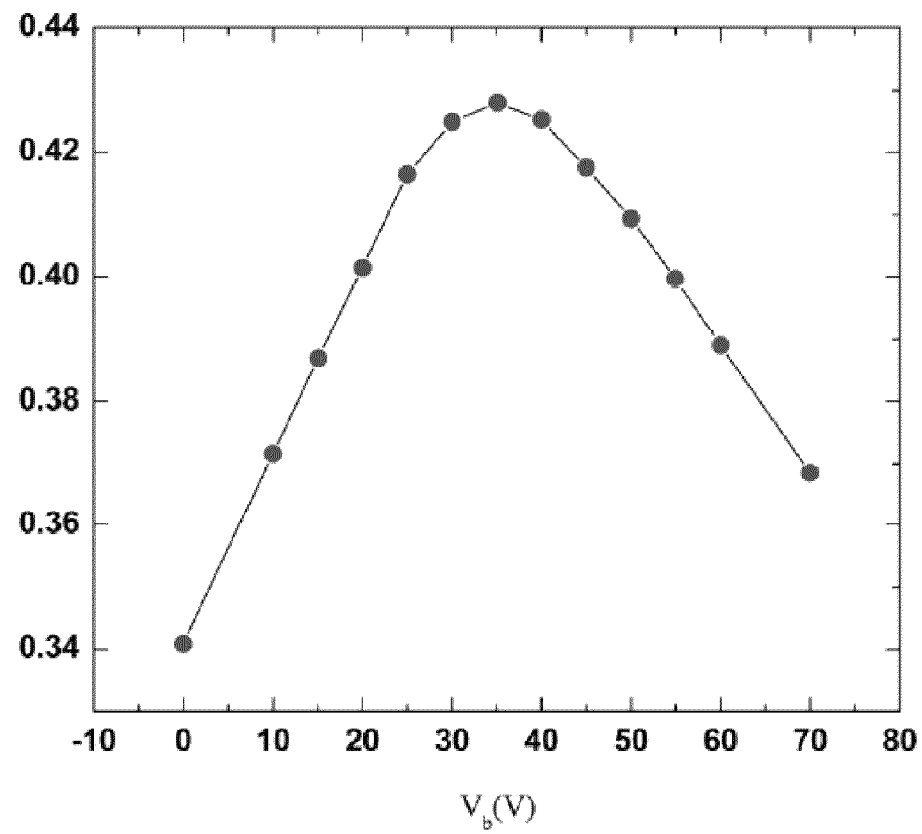

FIG. 12 is a graph showing a dependence of Hall angle $$\alpha = \frac{R_{yx}}{R_{xx}}$$

on different back gate voltages ($V_b$) of the embodiment of FIG. 10.

Figure 13:
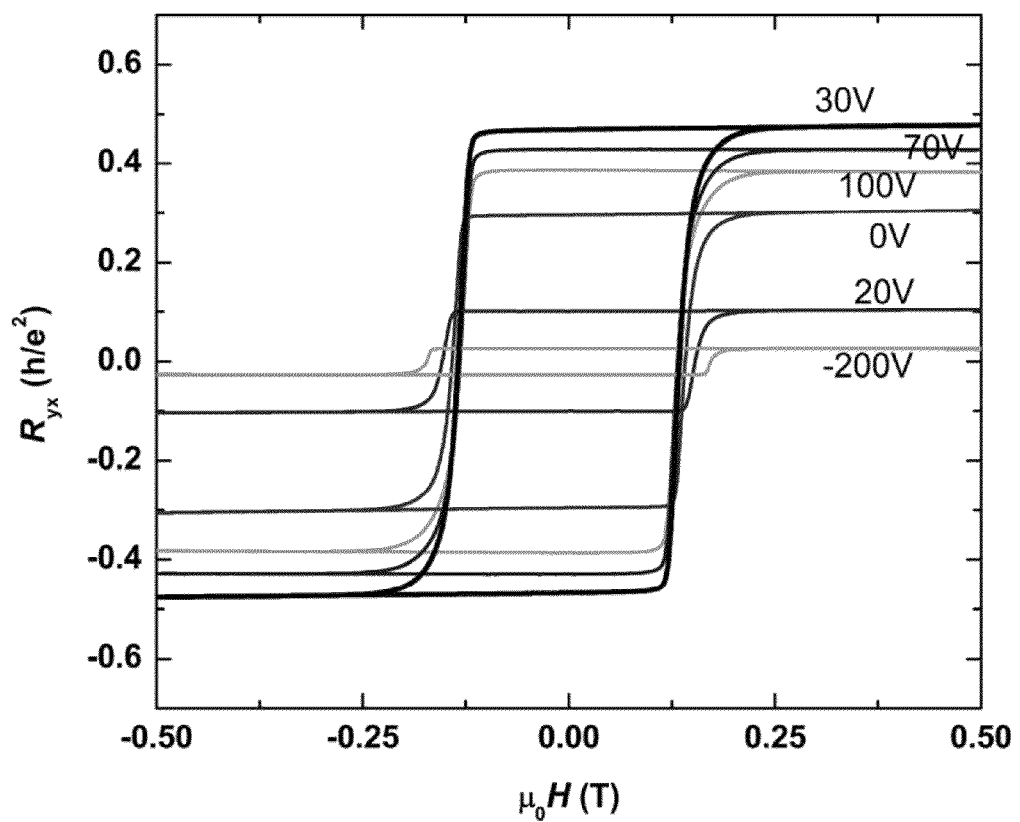

FIG. 13 is a graph showing magnetic field ($\mu_0 H$) dependent Hall resistances ($R_{yx}$) of yet another embodiment of magnetically doped TI quantum well film at different back gate voltages ($V_b$), wherein the unit of $R_{yx}$ is quantum resistance ($h/e^2$, i.e., 25.8 kΩ).

Figure 14:
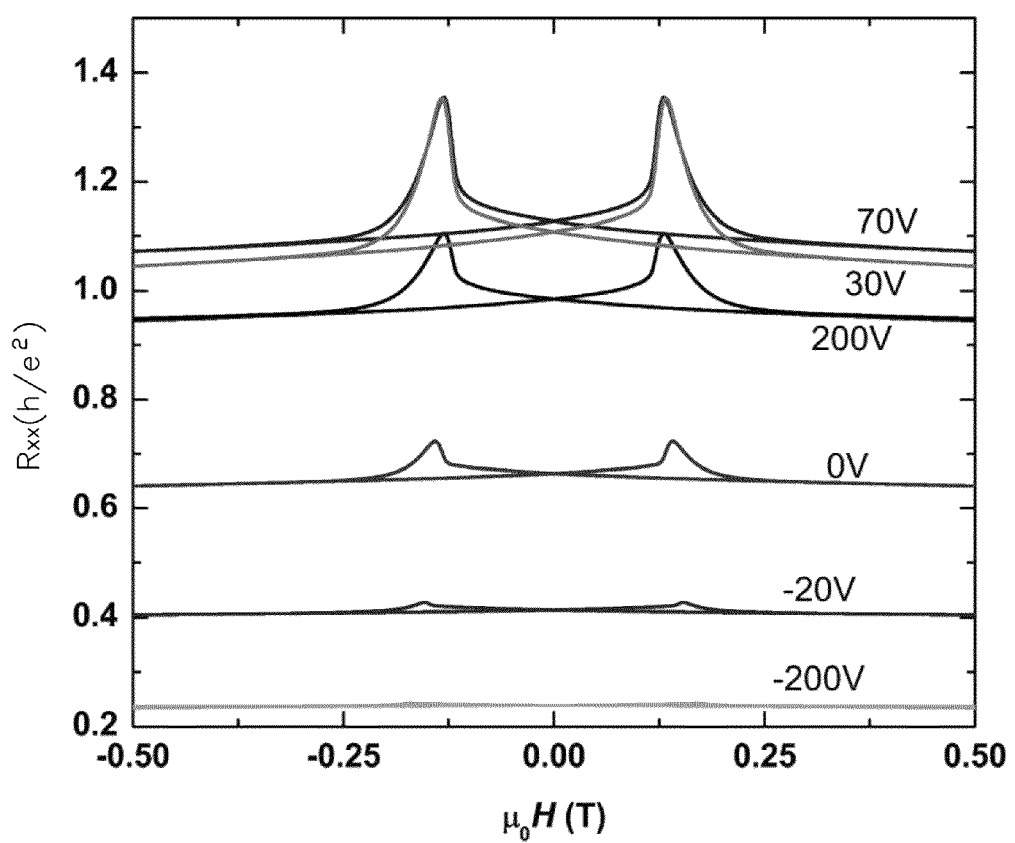

FIG. 14 is a graph showing magnetic field ($\mu_0 H$) dependent longitudinal resistances ($R_{xx}$) of the embodiment of FIG. 13 at different back gate voltages ($V_b$), wherein the unit of $R_{xx}$ is quantum resistance ($h/e^2$, i.e., 25.8 kΩ).

Figure 15:
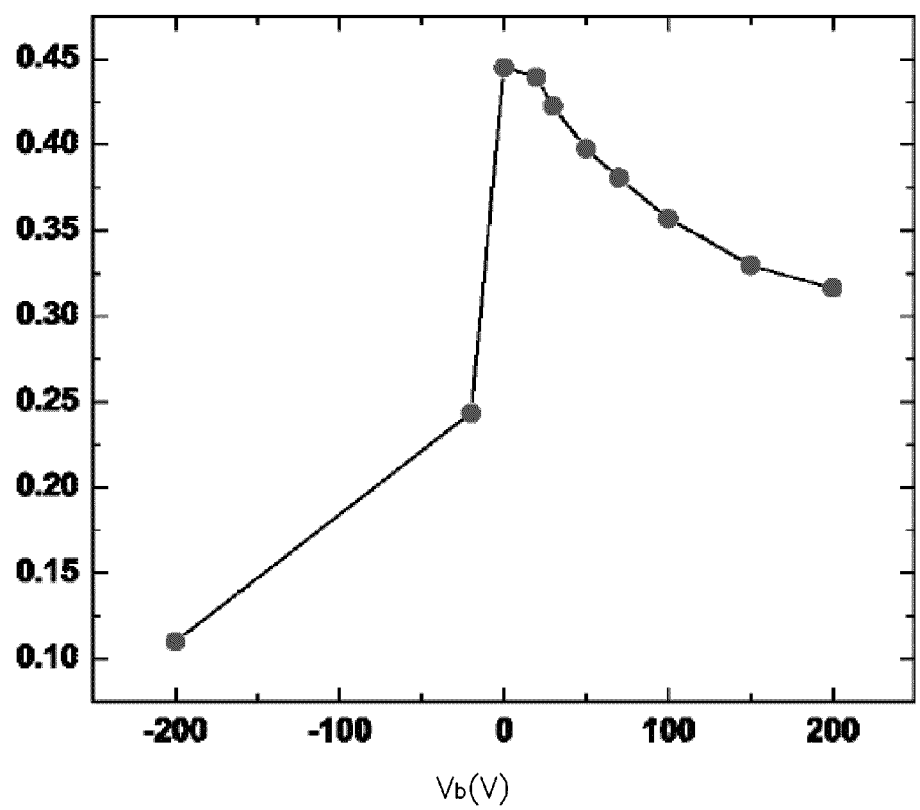

FIG. 15 is a graph showing a dependence of Hall angle $$\alpha = \frac{R_{yx}}{R_{xx}}$$

on different back gate voltages ($V_b$) of the embodiment of FIG. 13.

Figure 16:
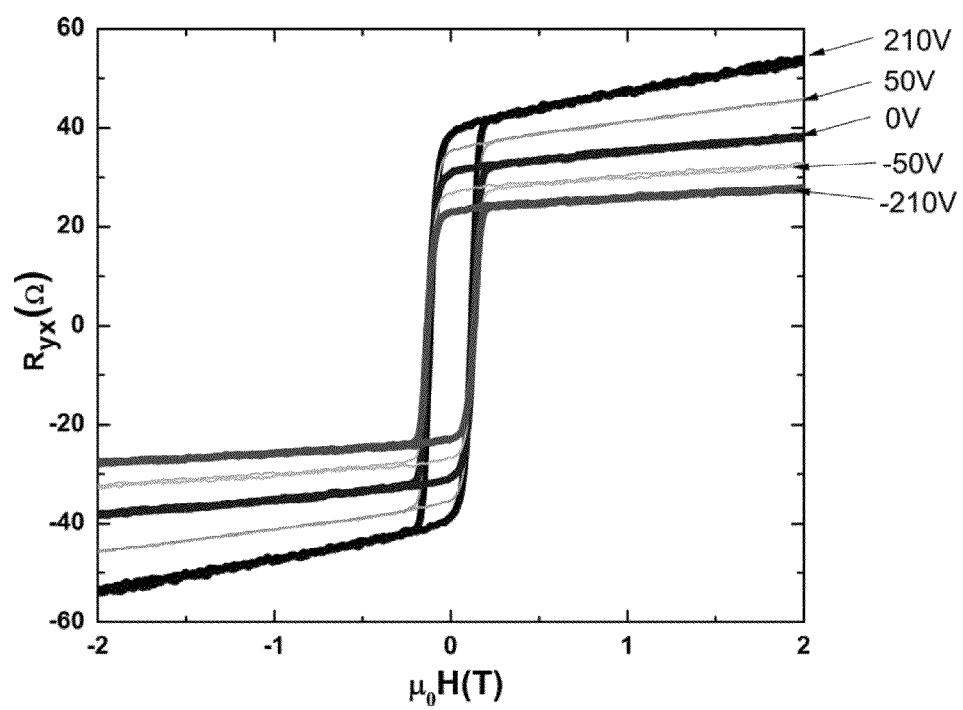

FIG. 16 is a graph showing magnetic field ($\mu_0 H$) dependent Hall resistances ($R_{yx}$) of a comparative sample (1) at different back gate voltages ($V_b$), wherein the unit of $R_{yx}$ is Ω.

Figure 17:
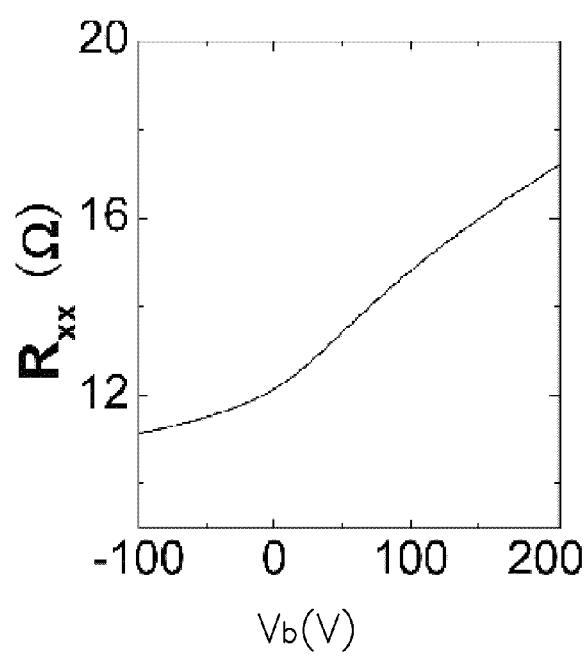

FIG. 17 is a graph showing a dependence of longitudinal resistance ($R_{xx}$) on different back gate voltages ($V_b$) of the comparative sample (1) of FIG. 16, wherein the unit of $R_{xx}$ is Ω.

Figure 18:
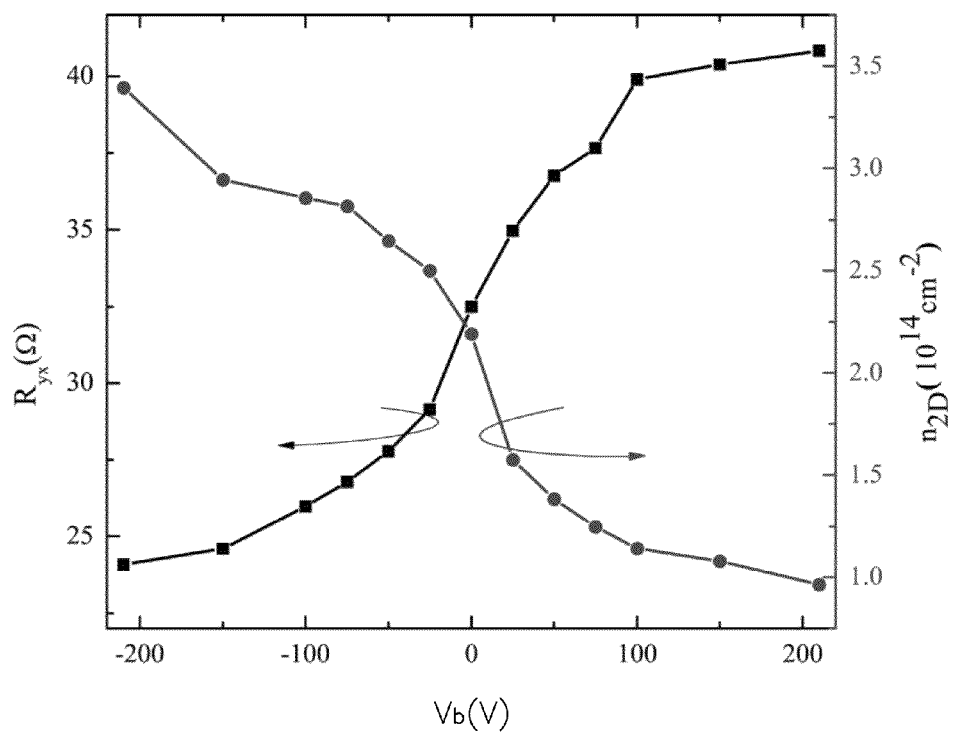

FIG. 18 is a graph showing dependences of $R_{yx}$ and carrier density ($n_{2D}$) on different back gate voltages ($V_b$) of the comparative sample (1) of FIG. 16, wherein the unit of $R_{yx}$ is Ω.

Figure 19:
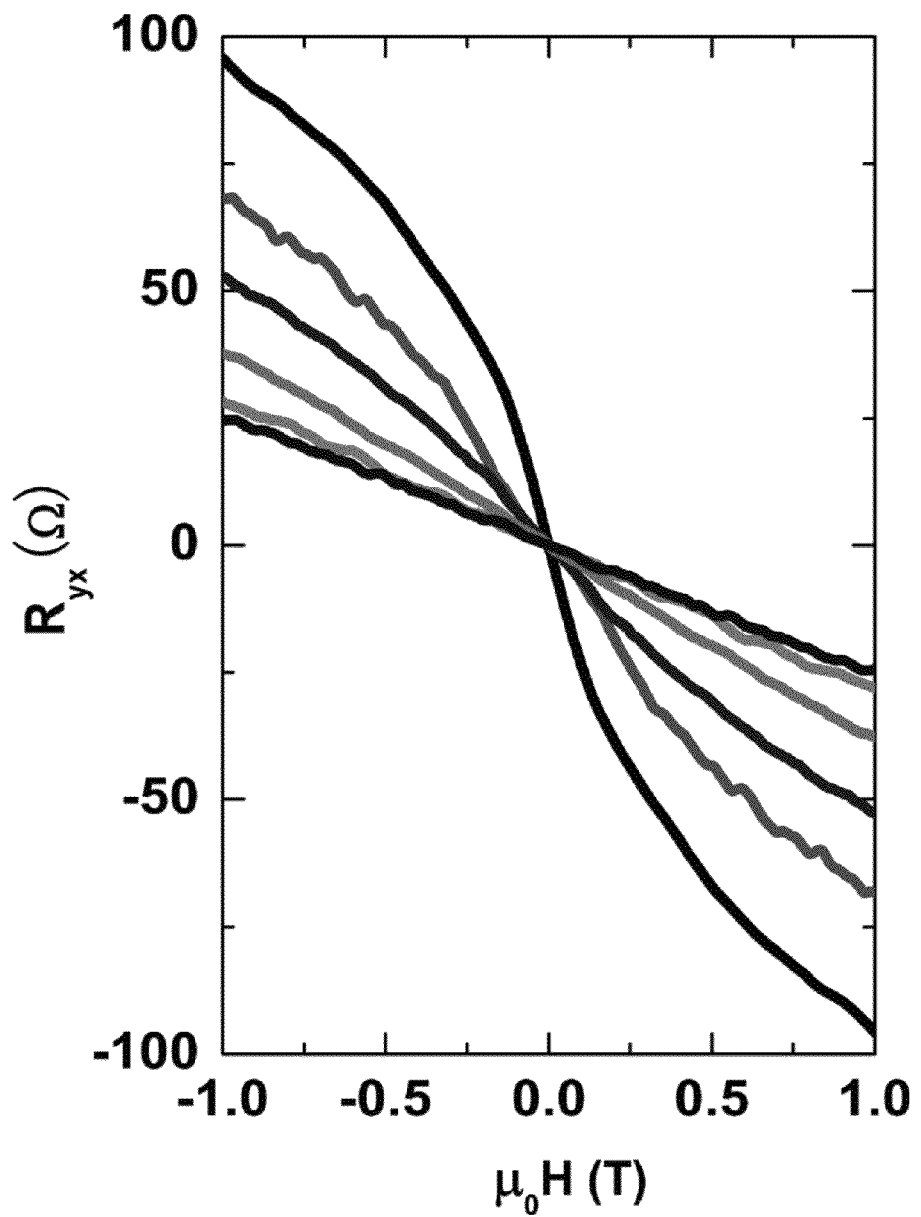

FIG. 19 is a graph showing magnetic field ($\mu_0 H$) dependent Hall resistances ($R_{yx}$) of a comparative sample (2) at different back gate voltages ($V_b$), wherein the unit of $R_{yx}$ is Ω.

Figure 20:
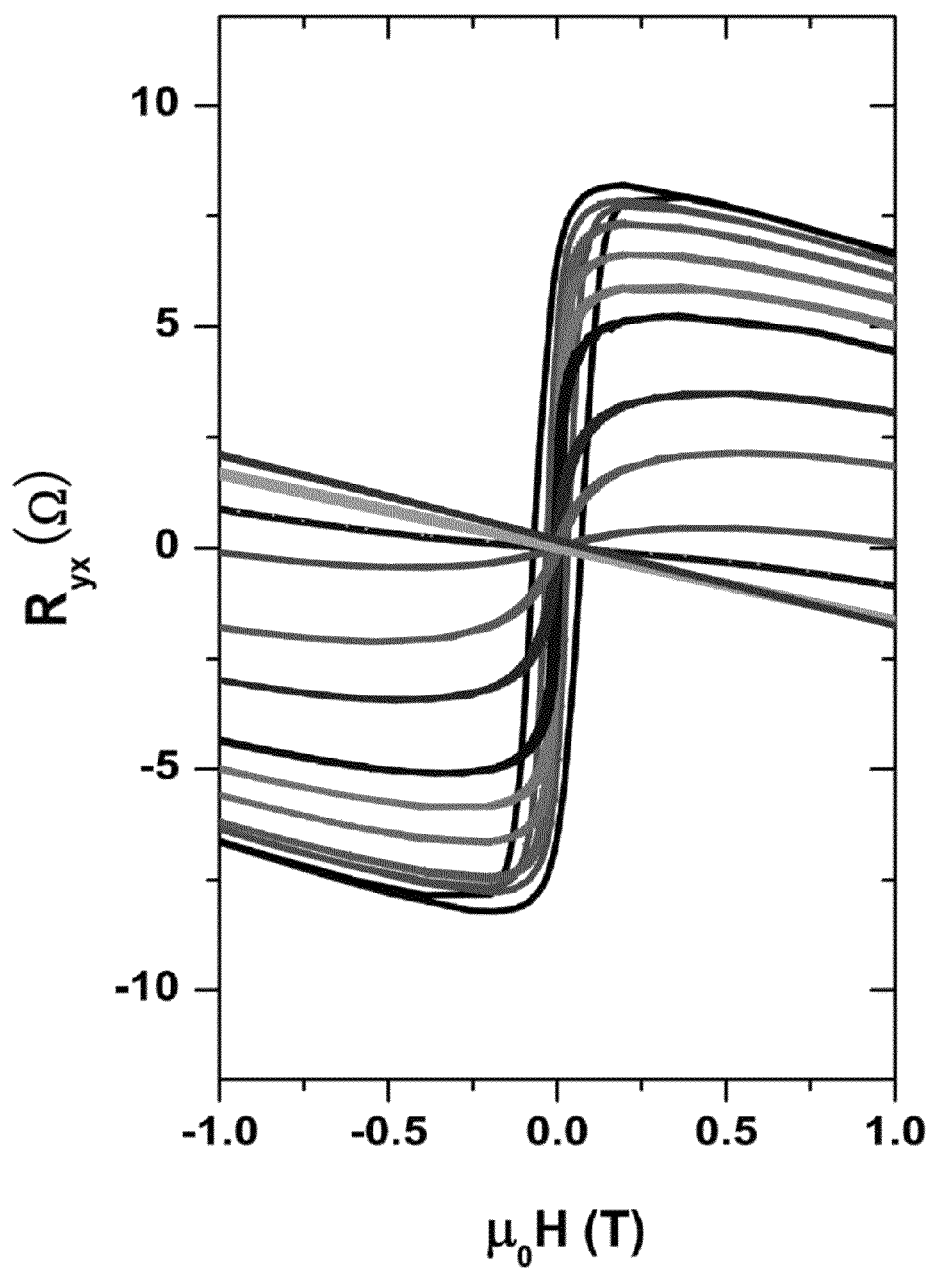

FIG. 20 is a graph showing magnetic field ($\mu_0 H$) dependent Hall resistances ($R_{yx}$) of a comparative sample (3) at different back gate voltages ($V_b$), wherein the unit of $R_{yx}$ is Ω.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

An embodiment of a method for generating QAHE includes steps of:

S21, forming a TI quantum well film in a 3 QL thickness to 5 QL thickness on the insulating substrate;

S22, doping the TI quantum well film with a first chemical element and a second chemical element during the forming of the TI quantum well film to form the magnetically doped TI quantum well film, the doping with the first chemical element and the second chemical element respectively introducing hole type charge carriers and electron type charge carriers in the magnetically doped TI quantum well film, to decrease the carrier density of the magnetically doped TI quantum well film to be smaller than or equal to $1 \times 10^{13}$ cm$^{-2}$, one of the first element and the second element magnetically doping the TI quantum well film (i.e., one of the first element and the second element is the magnetically dopant to the topological insulator quantum well film);

S23, applying an electric field to the magnetically doped TI quantum well film to further decrease the carrier density to a degree at which the QAHE is achieved.

The steps S21 and S22 are performed simultaneously. The forming of the TI quantum well film is the doping of the TI quantum well film to form the magnetically doped TI quantum well film.

A material of the undoped TI quantum well film can be antimony telluride ($Sb_2Te_3$). A material of the magnetically doped TI quantum well film can be $Sb_2Te_3$ doped by chromium (Cr) and bismuth (Bi) substituting some of the Sb in the $Sb_2Te_3$, which can be represented by a chemical formula $Cr_y(Bi_xSb_{1-x})_{2-y}Te_3$, wherein $0<x<1$, $0<y<2$. The doping with Cr introduces hole type charge carriers and the doping with Bi introduces electron type charge carriers into the magnetically doped TI quantum well film. The values of x and y satisfy that the amount of the hole type charge carriers introduced by the Cr doping is substantially equal to the amount of the electron type charge carriers introduced by the Bi doping. By satisfying this, the carrier density of the magnetically doped TI quantum well film is equal to or smaller than $1 \times 10^{13}$ cm$^{-2}$ without applying a voltage thereto (i.e., at zero electric field). Thus, the effectiveness of a gate voltage tuning method can be guaranteed during the realization of the QAHE by the magnetically doped TI quantum well film. The magnetically doped TI quantum well film has 3 QL to 5 QL, and has a thickness in a range from 3 QL thickness to 5 QL thickness (about 3 nanometers to about 5 nanometers), wherein "QL" means "quintuple layer". "QL thickness" means the thickness of the quintuple layer.

Figure 1:
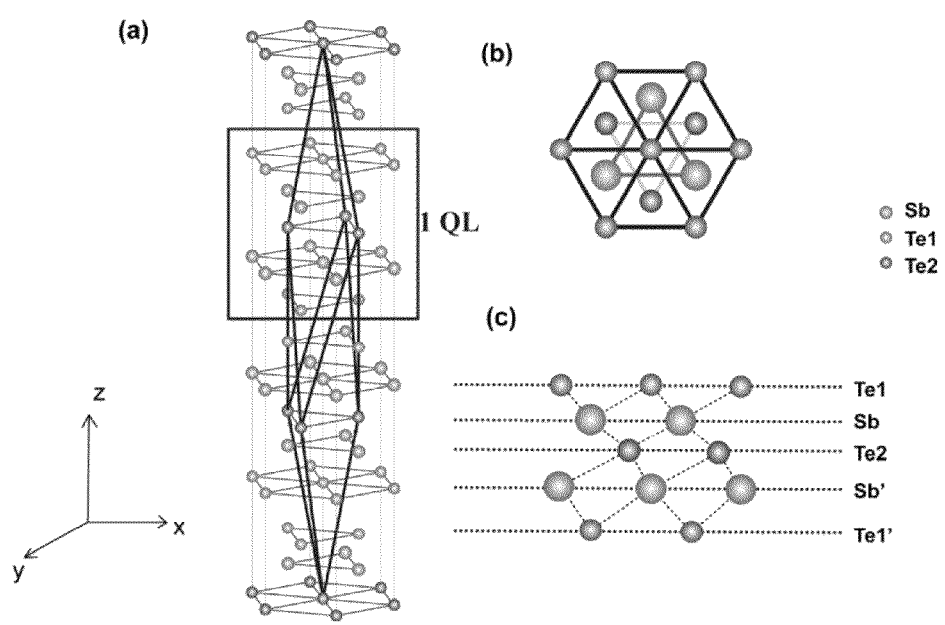
FIG. 1 is a schematic view of a schematic crystal structure of $Sb_2Te_3$, wherein (a) is a perspective view, (b) is a top view, and (c) is a side view of 1QL.

The magnetically doped TI quantum well film is formed by doping the $Sb_2Te_3$ with Cr atoms and Bi atoms to replace some of the Sb atoms therein. $Sb_2Te_3$ is a layer-type material, belonging to the trigonal crystal system, and has a space group of $D_{3d}^5$(R$\bar{3}$m). Referring to FIG. 1, on the xy plane, Sb atoms and Te atoms are respectively arranged in a hexagonal close packing style to form Sb atom layers and Te atom layers. Sb atom layers and Te atom layers are alternately laminated along the direction z perpendicular to the xy plane. Each QL consists of five adjacent atom layers. In $Cr_y(Bi_xSb_{1-x})_{2-y}Te_3$, the five adjacent atom layers of one QL are the first Te atom layer (Te1), the Cr and Bi doped first Sb atom layer (Sb1), the second Te atom layer (Te2), the Cr and Bi doped second Sb atom layer (Sb1'), and the third Te atom layer (Te1'). In a single QL, the Sb (or Cr, Bi) atoms and Te atoms are joined by covalent-ionic bonds. Between adjacent QLs, the Te1 and Te1' are combined by van der Waals force, thus forming cleavage planes between adjacent QLs. In $Cr_y(Bi_xSb_{1-x})_{2-y}Te_3$, the values of x and y satisfy that the amount of the hole type charge carriers introduced by the doping with Cr is substantially equal to the amount of the electron type charge carriers introduced by the doping with Bi. In one embodiment, $0.05<x<0.3$, $0<y<0.3$, and $1:2<x:y<2:1$ (e.g., $2:3 \leq x:y \leq 25:22$).

The material of the insulating substrate is not limited, and only needs to be capable of having the magnetically doped TI quantum well film located, grown, and/or formed thereon by a molecular beam epitaxy (MBE) method. In one embodiment, the material of the insulating substrate can have a dielectric constant greater than 5000 at a temperature equal to or smaller than 10 Kelvin (K), such as strontium titanate (STO). To achieve the QAHE, a chemical potential of the magnetically doped TI quantum well film is tuned by applying an external electric field or voltage to the magnetically doped TI quantum well film which is called the gate voltage tuning method. More specifically, the electric field or voltage can be applied to the magnetically doped TI quantum well film through a top gate and/or a back gate on the magnetically doped TI quantum well film. The chemical potential of the magnetically doped TI quantum well film can be tuned by the field effect. To achieve the QAHE, the defects in the magnetically doped TI quantum well film need to be as few as possible to decrease the carrier density in the magnetically doped TI quantum well film. However, the top gate is formed by forming a dielectric layer and a metal electrode on a surface of the magnetically doped TI quantum well film, which increases the possibility of destroying the magnetically doped TI quantum well film or introducing defects into the magnetically doped TI quantum well film. The insulating substrate, having a relatively large dielectric constant at a relatively low temperature, can have a relatively large capacitance, though the thickness of the insulating substrate is relatively large. Thus, the insulating substrate having the relatively large dielectric constant can be directly used as the dielectric layer at the relatively low temperature between the back gate and the magnetically doped TI quantum well film. The insulating substrate has a first surface and a second surface opposite to the first surface. The magnetically doped TI quantum well film can be formed on the first surface. The back gate is formed by forming a metal electrode on the second surface of the insulating substrate. The forming of the back gate does not contact to the magnetically doped TI quantum well film, thus avoids of introducing defects to the magnetically doped TI quantum well film. When the material of the insulating substrate is STO, the magnetically doped TI quantum well film can be grown on a (111) surface, which is used as the first surface. The (111) surface is a surface along a (111) crystallographic plane of the STO. The thickness of the STO insulating substrate can be in a range from about 0.1 millimeters to about 1 millimeter.

In the steps S21 and S22, the magnetically doped TI quantum well film can be formed on the insulating substrate through a molecular beam epitaxy (MBE) method. One embodiment for forming the magnetically doped TI quantum well film includes following steps of:

S11, providing the STO substrate having the (111) surface, the STO substrate is disposed in a ultra-high vacuum environment in an MBE reactor chamber;

S12, cleaning the surface of the STO substrate by heat-treating the STO substrate in the MBE chamber;

S13, heating the STO substrate and forming Bi beam, Sb beam, Cr beam, and Te beam in the MBE chamber in a controlled ratio achieved by controlling flow rates of the Bi beam, Sb beam, Cr beam, and Te beam; and S14, forming the magnetically doped TI quantum well film on the (111) surface of the STO substrate, wherein the controlled ratio of the Bi beam, Sb beam, Cr beam, and Te beam makes that in the magnetically doped TI quantum well film, the amount of the hole type charge carriers introduced by the doping with Cr is substantially equal to the amount of the electron type charge carriers introduced by the doping with Bi.

In the step S11, the (111) surface of the STO substrate is smooth at atomic level. In one embodiment, the (111) surface of the STO substrate is formed by steps of: cutting the STO substrate along the (111) crystallographic plane; heating the STO substrate in deionized water below 100° C. (e.g., 70° C.); and burning the STO substrate in an environment of a combination of $O_2$ and Ar at a temperature in a range from about 800° C. to about 1200° C. (e.g., 1000° C.). A time period for the heating in the deionized water can be in a range from about 1 hour to about 2 hours. A time period for the burning in the environment of the combination of $O_2$ and Ar can be in a range from about 2 hours to about 3 hours.

MBE is a film evaporation-deposition method performed in ultra-high vacuum (in a range from $1.0 \times 10^{-11}$ mbar to $1.0 \times 10^{-9}$ mbar, e.g., about $1.0 \times 10^{-10}$ mbar) at a deposition rate in a range from about 0.1 nm/s to about 1 nm/s to evaporate a source and deposit the film at a low speed which allows films to grow epitaxially. The absence of carry gases as well as the ultra high vacuum environment results in the highest achievable purity of grown films. The MBE reactor chamber can be joined with a variable temperature scanning tunneling microscope (VTSTM) and angle resolved photoemission spectroscopy (ARPES) to form a system. The system can have in-situ VTSTM and ARPES tests of the magnetically doped TI quantum well film.

During the forming of the magnetically doped TI quantum well film and the VTSTM and ARPES tests of the magnetically doped TI quantum well film, the magnetically doped TI quantum well film is kept in the MBE reactor chamber having a degree of vacuum smaller than $1.0 \times 10^{-10}$ mbar (a pressure is less than $1.0 \times 10^{-8}$ Pa). In this degree of vacuum, the density of the gas molecules at room temperature is about $2.4 \times 10^6$/ $cm^3$, and the average distance between the gas molecules is about 0.1 millimeters. In this ultra-high vacuum environment, the magnetically doped TI quantum well film having high purity and few defects can be formed using the MBE method. Meanwhile, in this ultra-high vacuum environment, the (111) surface of the magnetically doped TI quantum well film can be kept clean for a long time. In one embodiment, the MBE reactor chamber has a degree of vacuum less than or equal to $5.0 \times 10^{-10}$ mbar.

In the step S12, the temperature and time of the heat-treating are selected to make the (111) surface of the STO substrate as clean as possible. In one embodiment, the temperature of the heat-treating is about 600° C., and the time of the heat-treating is about 1 hour to about 2 hours. The heat-treating can remove organic substances, gas, and water adsorbed on the (111) surface of the STO substrate.

Figure 2:
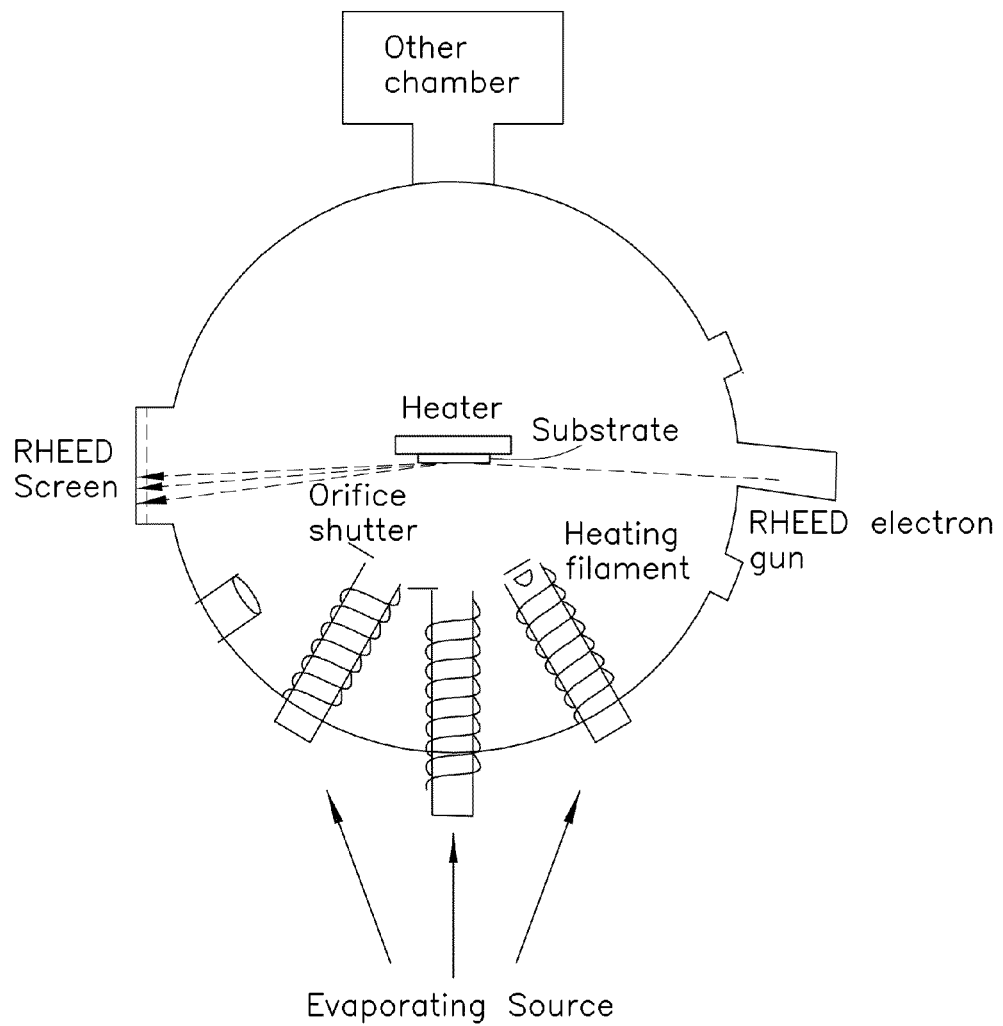
FIG. 2 is a schematic view of an MBE reactor chamber.

In the step S13, the beams of Bi, Sb, Cr, and Te can be generated by heating evaporating sources of Bi, Sb, Cr and Te. FIG. 2 shows that in the reactor chamber, four independent evaporating sources can be arranged by respectively disposing solid Bi, Sb, Cr, and Te in four Knudsen cells (K-Cell). One Knudsen cell is composed of a crucible, a heating filament, a water cooling system, an orifice shutter, and a thermocouple. A material of the crucible can be pyrolytic boron nitride or $Al_2O_3$. The solid Bi, Sb, Cr, and Te are respectively disposed in the crucibles. All the solid Bi, Sb, Cr, and Te have the purity larger than or equal to 5N degree (99.999%). The heating filaments (e.g., tantalum filaments or tungsten filaments) are used to heat the crucibles to evaporate the solid Bi, Sb, Cr, and Te, and the evaporating rate is controlled by controlling the heating temperature. The orifice shutter is used to cover the crucible to control the beginning and ending of the evaporation. Thus, the uniformity of the ratio among the Bi, Sb, Cr, and Te in the formed magnetically doped TI quantum well film can be controlled. The water cooling system is used to decrease the temperature around the evaporating source, thus keeps a relatively good vacuum and decreases the impurity in the MBE reactor chamber. The STO substrate is disposed in the MBE reactor chamber and spaced from the evaporating sources. The (111) surface of the STO substrate faces to the evaporating sources. A heater can be further located on a back side (e.g., near the second surface) of the STO substrate opposite to the (111) surface to heat the STO substrate.

The flow rate can be a mass flow rate or a volumetric flow rate, which is a mass or a volume of a fluid passing through a given surface per unit of time. The flow rates of Bi, Sb, Cr, and Te are represented as $V_{Bi}$, $V_{Sb}$, $V_{Cr}$, and $V_{Te}$ respectively, and satisfy $V_{Te}>(V_{Cr}+V_{Bi}+V_{Sb})$, to ensure that the magnetically doped TI quantum well film is formed in a Te environment, to decrease the amount of Te vacancies in the magnetically doped TI quantum well film. In one embodiment, $(V_{Cr}+V_{Bi}+V_{Sb}):V_{Te}$ is in a range from about 1:10 to about 1:15. However, the $V_{Te}$ cannot be too large. A relatively large $V_{Te}$ tends to induce an aggregation of the Te atoms on the (111) surface of the STO substrate. The $V_{Bi}$, $V_{Sb}$, $V_{Cr}$, and $V_{Te}$ can be controlled by controlling the temperatures of the four evaporating sources, and can be measured by a flow meter (e.g., quartz oscillation type gas flow meter).

In step S14, during the forming of the magnetically doped TI quantum well film, the STO substrate may need to be heated to a proper temperature (e.g., in a range from about 180° C. to about 250° C.). The temperature of the heating of the STO substrate can ensure the decomposition of $Te_2$ and/or $Te_4$ molecule into Te atoms, while ensuring the formation of a single crystal magnetically doped TI quantum well film. An approximate value of the ratio among the Bi, Sb, Cr, and Te in the magnetically doped TI quantum well film can be estimated by the flow meter, and an accurate value can be achieved by chemical element analysis of a thick sample (e.g., having a thickness of 100 QL) formed by the same method. In one embodiment, the heating temperature of the substrate ($T_{sub}$) is about 180° C. to about 200° C., the evaporating temperature of Te source ($T_{Te}$) is about 310° C., the evaporating temperature of Bi source ($T_{Bi}$) is about 500° C., the evaporating temperature of Sb source ($T_{Sb}$) is about 360° C., and the evaporating temperature of Cr source ($T_{Cr}$) is about 1020° C. The STO substrate can be heated by tungsten filaments disposed on the back side of the STO substrate. In one embodiment, when the magnetically doped TI quantum well film is a 5 QL film, the first QL of the magnetically doped TI quantum well film is formed at a lower heating temperature of the STO substrate (e.g., $T_{sub}=180°$ C.), and the other 4 QL are formed on the first QL at a higher heating temperature (e.g., $T_{sub}=200°$ C.). A high temperature of the STO substrate may cause the surface of the first QL to be uneven. These two temperature periods can ensure that the first QL uniformly and flat on the substrate at a lower temperature, and the other 4 QL can have a high quality at the higher temperature.

After step S14, a step of annealing the magnetically doped TI quantum well film can be processed to further decrease the defects in the magnetically doped TI quantum well film. The magnetically doped TI quantum well film can be heated at an annealing temperature for an annealing time. In one embodiment, the annealing temperature can be in a range from about 180° C. to about 250° C. (e.g., 200° C.), an annealing time can be in a range from about 10 minutes to about 1 hour (e.g., 20 minutes).

Formation of the magnetically doped TI quantum well film is not limited to the above described method. In another embodiment, the material of the insulating substrate can be $Al_2O_3$, and the insulating substrate can be a single crystal sapphire substrate. However, because the dielectric constant of sapphire is only about 20 at a low temperature, the sapphire substrate cannot be used as the dielectric layer for the back gate. Thus, the top gate structure may be used to tune the chemical potential of the magnetically doped TI quantum well film. More specifically, a solid dielectric layer (e.g., $Al_2O_3$ film, $HfO_2$ film, or MgO film) having a small thickness (e.g., 300 nanometers) can be formed on the surface of the magnetically doped TI quantum well film, and a metal electrode as the top gate can then be formed on the surface of the dielectric layer.

In another embodiment, to avoid damaging or negatively affecting the structure of the magnetically doped TI quantum well film, a liquid top gate structure can be used to tune the chemical potential. More specifically, a liquid dielectric layer can be formed by dropping a drop of ionic liquid on the surface of the magnetically doped TI quantum well film, and a metal electrode as the top gate can be arranged to be in contact with the liquid dielectric layer but spaced from the magnetically doped TI quantum well film.

In step S23, when the insulating substrate has a relatively large dielectric constant, the electric field can be applied only by the back gate structure. The electric field can be in a range of ±200V. Step S23 can be processed at a low temperature (e.g., smaller than or equal to 10 Kelvin (K)). In one embodiment, the step S23 is processed at a temperature smaller than or equal to 1.5 K.

As mentioned in the background, $Sb_2Te_3$ TI film makes it possible to realize the QAHE. Theoretically, Cr can equivalently substitute Sb of the $Sb_2Te_3$ to achieve the Cr doped $Sb_2Te_3$. The QAHE can be achieved by doping the $Sb_2Te_3$ TI film with Cr having an infinite uniformity to achieve the ferromagnetism of the TI film. This ferromagnetism achieved by the doping is different from RKKY type ferromagnetism in traditional diluted magnetic semiconductors and does not need charge carriers, thus keeping the system in the insulating state.

Figure 3:
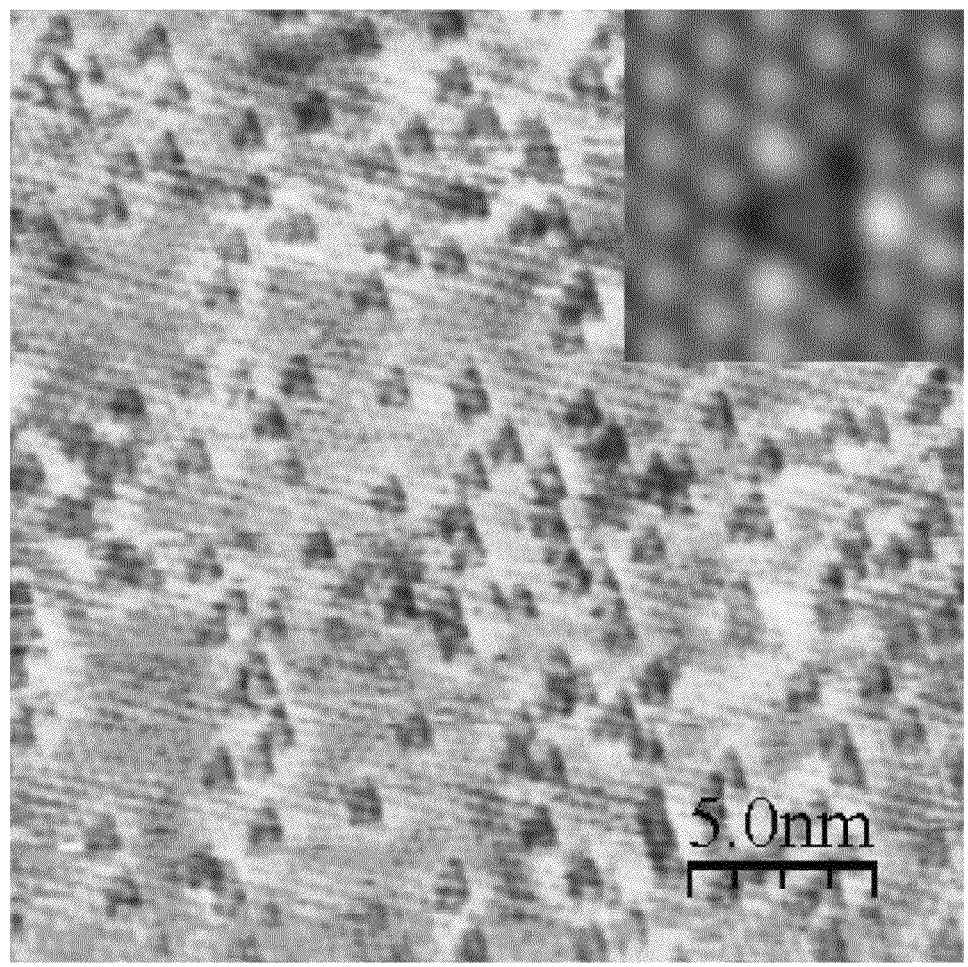
FIG. 3 is a scanning tunneling microscope (STM) image of Cr doped $Sb_2Te_3$.

However, the inventors found that in a real system, the carrier density in the Cr doped $Sb_2Te_3$ is very large. The carrier density can be calculated by $n_{2D}=1/eR_H$, wherein $R_H$ is a slope (or gradient) of a Hall curve (i.e., a curve of magnetic field to Hall resistance). The tested carrier density of the $Sb_2Te_3$ quantum well film with Cr doped on Sb sites has a carrier density in a scale of $10^{14}$ cm$^{-2}$. It is impossible to tune that large of a carrier density by using either back gate structure or top gate structure. That large of a carrier density is mainly caused by the defects introduced during the Cr doping of the $Sb_2Te_3$. Numerous factors such as forming conditions and environment conditions affect the forming of the film. It is extremely difficult to dope the $Sb_2Te_3$ with Cr to the infinite degree of uniformity. During the Cr doping, the defects are introduced into the $Sb_2Te_3$ quantum well film. FIG. 3 shows that an image of Cr doped $Sb_2Te_3$ at atomic resolution achieved by VTSTM, the triangle shaped defects are the locations of Cr dopants. Theoretically, the substitution of Sb atoms with Cr atoms does not introduce extra charge carriers. However, in a real system, the doping cannot be infinitely uniform. Non-bonded Cr atoms can exist in the film and introduce extra charge carriers, which is the hole type charge carriers tested by inventors. The carrier density is too large to be decreased to a level to realize the QAHE.

In the present disclosure, to solve the problem that the magnetic dopant (e.g., Cr) may introduce defects, another dopant (e.g., Bi) which can introduce the adverse type of defects is used with the magnetic dopant, and the gate voltage tuning method is also used. Thus, the QAHE can be realized. For example, $Sb_2Te_3$ is doped by both Cr and Bi to form a quaternary system in the film. The doping of $Sb_2Te_3$ with Cr and Bi can simultaneously introduce two adverse types of defects. The defects (hole type) introduced by Cr can be substantially neutralized by the defects (electron type) introduced by another kind of dopant (e.g., Bi), thus decreasing the carrier density in the material. Thus, the quaternary system can have the ferromagnetic property while having a low level of carrier density. The amount of Bi doped in the $Sb_2Te_3$ (i.e., the value of x in $Cr_y(Bi_xSb_{1-x})_{2-y}Te_3$) depends on the amount of defects introduced by Cr. The amount of defects introduced by Cr may be affected by factors such as forming conditions and environmental conditions. The amount of defects introduced by Cr can be analyzed previously by forming a $Cr_ySb_{2-y}Te_3$ film under the same conditions. In one embodiment, $0.05<x<0.3$, $0<y<0.2$, and $1:2<x:y<2:1$ (e.g., $2:3 \le x:y \le 25:22$). By adjusting the amount of Bi and Cr (i.e., adjusting the values of x and y), the amount of the hole type charge carriers introduced by the doping with Cr is substantially equal to the amount of the electron type charge carriers introduced by the doping with Bi, and the carrier density in the magnetically doped TI quantum well film can be decreased to a level that is capable of being tuned by the gate tuning method. By using the gate tuning method to tune the quaternary system, the magnetically doped TI quantum well film can have the carrier density near zero, and have the anomalous Hall resistance ($R_{AH}$) in a range of $0.3 \times 25.8$ k$\Omega \le R_{AR} \le 1 \times 25.8$ k$\Omega$ (i.e., $7.74$ k$\Omega \le R_{AR} \le 25.8$ k$\Omega$), while the anomalous Hall angle is ($\alpha = R_{AH}/R_{xx}) \ge 0.2$.

An embodiment of an electrical device based on the magnetically doped TI quantum well film is provided. The electrical device includes the above described magnetically doped TI quantum well film. The electrical device includes an insulating substrate including a first surface and a second surface opposite to the first surface, and the magnetically doped TI quantum well film grown on the first surface of the insulating substrate. A material of the magnetically doped TI quantum well film is represented by a chemical formula of $Cr_y(Bi_xSb_{1-xl})_{2-y}Te_3$, wherein $0<x<1$, $0<y<2$. The doping with Cr introduces hole type charge carriers and the doping with Bi introduces electron type charge carriers into the magnetically doped TI quantum well film. The values of x and y satisfy that the amount of the hole type charge carriers introduced by the doping with Cr is substantially equal to the amount of the electron type charge carriers introduced by the doping with Bi. The thickness of the magnetically doped TI quantum well film is in a range from 3 QL to 5 QL. The anomalous Hall resistance ($R_{AH}$) of the magnetically doped TI quantum well film is in a range of $0.3 \times 25.8$ k$\Omega \le R_{AR} \le 1 \times 25.8$ k$\Omega$ (i.e., $7.74$ k$\Omega \le R_{AR} \le 25.8$ k$\Omega$), while the anomalous Hall angle is ($\alpha = R_{AH}/R_{xx}) \ge 0.2$.

In one embodiment, the electrical device further includes a back gate electrode and two conducting electrodes (i.e., source electrode and drain electrode). The back gate electrode is used to tune the chemical potential of the magnetically doped TI quantum well film. The two conducting electrodes are used to conduct an electrical current through the magnetically doped TI quantum well film along a first direction.

In one embodiment, the electrical device can further include three output electrodes (e.g., E1, E2 and E3), which are used to test the resistances of the magnetically doped TI quantum well film in the first direction (i.e., the longitudinal resistance) and in the second direction (i.e., the Hall resistance).

All the above mentioned electrodes can be formed by using an E-beam method. The material of the electrodes can be selected according to having good conductivity (e.g., gold or titanium). In another embodiment, the electrodes can be formed by coating an indium paste or silver paste on the surface of the magnetically doped TI quantum well film.

More specifically, the back gate electrode is located on the second surface of the insulating substrate. The two conducting electrodes and three output electrodes are arranged on the top surface of the magnetically doped TI quantum well film and spaced from each other. The two conducting electrodes and three output electrodes are electrically connected to the magnetically doped TI quantum well film. The two conducting electrodes are arranged at two opposite sides of the magnetically doped TI quantum well film. A line extending from one conducting electrode to the other conducting electrode is the first direction. A line extending from E1 to E2 is the first direction, and a line extending from E2 to E3 is the second direction. The first direction is perpendicular to the second direction. The E1, E2 and E3 can be arranged at two opposite sides in the second direction of the magnetically doped TI quantum well film. For example, E1 and E2 can be arranged to the same side, and E3 can be arranged on the other side. The two conducting electrodes can be bar shaped with a relatively long length approximately equal to the length of the magnetically doped TI quantum well film in the second direction. The length direction of the conducting electrodes can be parallel to the second direction. The three output electrodes can be spot electrodes.

Figure 4:
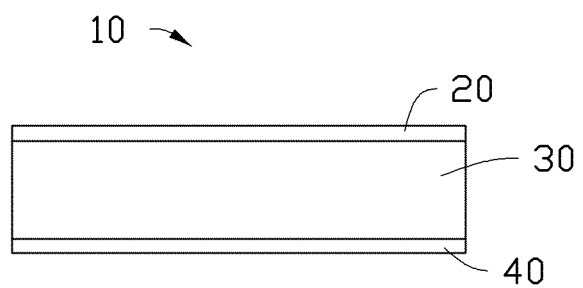
FIG. 4 is a side view of one embodiment of an electrical device.
Figure 5:
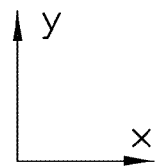
FIG. 5 is a top view of one embodiment of the electrical device of FIG. 4.
Figure 5:
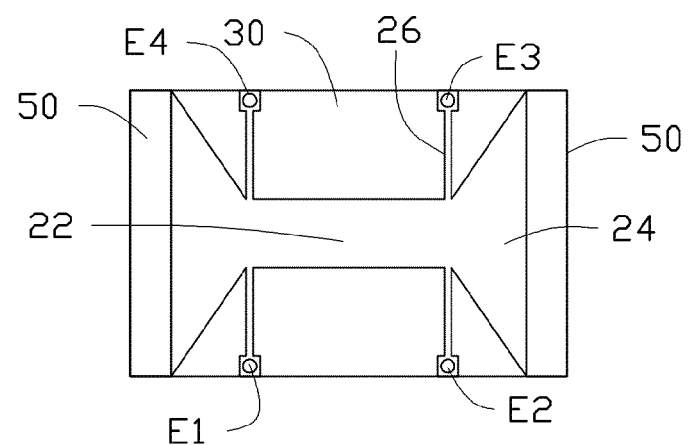

Referring to FIG. 4 and FIG. 5, in the figure, x represents the first direction and y represents the second direction. In one embodiment of the electrical device 10, the magnetically doped TI quantum well film 20 formed on the first surface of the insulating substrate 30 has a shape including a rectangular central part 22, two first connecting parts 24 extended from the central part 22 to the two conducting electrodes 50, and three second connecting parts 26 extended from the central part 22 to the E1, E2, and E3. The three second connecting parts 26 are spaced from each other. The length of the central part 22 in the second direction is smaller than the length of the conducting electrode 50. The first connecting parts 24 can have a trapezoid shape having two parallel sides parallel to the second direction, the longer one is joined to the conducting electrode 50, the shorter one is joined to the central part 22. The three second connecting parts 26 can extend along the second direction. In one embodiment, the three second connecting parts 26 can extend from three corners of the rectangle central part 22 to E1, E2, and E3. The back gate electrode 40 is located on the second surface of the insulating substrate 30.

The conducting electrode 50 can be located on a top surface of the first connecting parts 24 at a side. The pattern of the magnetically doped TI quantum well film 20 having the narrow rectangular central part 22 and the trapezoid shaped first connecting parts 24 connected to the long conducting electrode 50 can decrease the contacting resistance. The second connecting part 26 can have a strip shape with a narrow width. The output electrode is located on a top surface of the second connecting part 26 at one end. The other end of the second connecting part 26 is joined to the central part 22.

The rectangular central part 22 can have a length of about 100 microns to about 400 microns (e.g., 200 microns) in the first direction, and a length of about 10 microns to about 40 microns (e.g., 20 microns) in the second direction.

The conducting electrode 50 can have a length of about 1 millimeter to about 4 millimeters (e.g., 2 millimeters) in the second direction, and a length of about 5 millimeters to about 10 millimeters in the first direction.

In addition, the electrical device can further include a fourth output electrode E4 similar to E1, E2, and E3. E4 is spaced from E1, E2, and E3, and located on a surface of the magnetically doped TI quantum well film 20. A direction from E3 to E4 is the first direction, and a direction from the E1 to E4 is the second direction. Correspondingly, the magnetically doped TI quantum well film 20 can includes four second connecting parts 26 respectively extended from the central part 22 to E1, E2, E3, and E4 from the four corners of the central part 22.

The pattern of the magnetically doped TI quantum well film 20 can formed by removing other portion of the magnetically doped TI quantum well film 20 by mechanical scraping method, ultraviolet lithography method, or electron beam lithography method.

Experiments on Some Embodiments

Different embodiments of the electrical devices are formed by using different magnetically doped TI quantum well films. During an experiment of an electrical device, constant electric current is conducted through the magnetically doped TI quantum well film by the two conducting electrodes at a low temperature. Resistances $R_{xx}$ and $R_{yx}$ in different directions of the magnetically doped TI quantum well film are measured by using the three output electrodes, wherein $R_{xx}$ is the resistance along the direction of the constant electric current (i.e., the first direction), and $R_{yx}$ is the resistance along the direction perpendicular to the constant electric current (i.e., the second direction). The $R_{yx}$ is the Hall resistance. Top gate structure or back gate structure may be used to tune the chemical potential of the magnetically doped TI quantum well film in the experiment. The top gate voltage is represented by $V_t$, and the back gate voltage is represented by $V_b$.

The magnetic property of the magnetically doped TI quantum well film is studied by a superconducting quantum interference device (SQUID).

In the magnetic materials, $R_{yx} = R_A M(T,H) + R_N H$, wherein $R_A$ is the anomalous Hall coefficient, $M(T,H)$ is the magnetization, $R_N$ is the normal Hall coefficient. H is an external magnetic field. The value of the anomalous Hall resistance is defined as the value of the Hall resistance ($R_{yx}$) at zero magnetic field. The $R_A M(T,H)$ is the anomalous Hall resistance ($R_{AH} = R_A M(T,H)$), which is related to the magnetization (i.e., $M(T,H)$), and plays the major part of $R_{yx}$ at a low magnetic field. The $R_N H$ is the normal Hall resistance, which is the linear part of $R_{yx}$ at a high magnetic field. $R_N$ decides the carrier density ($n_{2D}$), and the type of the charge carriers. The following experiments are processed at near zero magnetic field (i.e., H=0). Thus, the $R_{yx}$ can be seen as equal to the $R_{AH}$.

Embodiment 1

T=30 mK, 5QL Sample, Back Gate Structure

The magnetically doped TI quantum well film is 5QL $Cr_{0.15}(Bi_{0.10}Sb_{0.9})_{1.85}Te_3$ (i.e., the film has 5 QL), and the substrate 30 is STO substrate, in the embodiment 1. Different back gate voltages (Vb) are applied to the magnetically doped TI quantum well film, and the corresponded Hall curves are tested at the temperature of 30 mK.

Referring to FIGS. 6 to 9, H is the magnetization and $\mu_0$ is the vacuum permeability, in the $\mu_0 H$. The unit of $\mu_0 H$ is Tesla (T). The $R_{AH}$ of the sample is changed with $V_b$, and the hysteresis phenomena can be seen, which means that the sample has a good ferromagnetic property. When $0V \leq V_b \leq 10V$, the change of $R_{AH}$ with $V_b$ is not very great. When $V_b = -4.5$ V, $R_{AH} = 25.8$ kΩ. The QAHE is realized.

Embodiment 2

T=1.5K, 4QL Sample, Back Gate Structure

The magnetically doped TI quantum well film is 4QL $Cr_{0.22}(Bi_{0.22}Sb_{0.78})_{1.78}Te_3$, and the substrate 30 is STO substrate, in the embodiment 2.

Different back gate voltages ($V_b$) are applied to the magnetically doped TI quantum well film, and the corresponded Hall curves are tested at the temperature of 1.5K. Referring to FIG. 10, the hysteresis phenomena can be seen, and the hysteresis loops have a "square" shape, which means that the sample has a great ferromagnetic property. By changing $V_b$, a relatively large $R_{AH}$ can be achieved. The $R_{AH}$ increases first and then decreases with the increasing of the $V_b$. When $V_b = 45$ V, $R_{AH}$ reaches the maximum value, which is 10 kΩ. This value is approximate to 0.4 quantum resistance, the quantum resistance is 25.8 kΩ. FIG. 11 shows that the $R_{xx}$–$\mu_0 H$ curves show a butterfly shaped hysteresis pattern, which also reveals that the sample has a great ferromagnetic property. In addition, when $V_b = 45V$, the anomalous Hall angle ($\alpha = R_{AH}/R_{xx}$) is as high as 0.42, which is twice of that value of the 5QL sample. FIG. 12 shows that the Hall angle ($R_{yx}/R_{xx}$) increases first and then decreases with the increasing of the $V_b$.

Embodiment 3

T=100 mK, 4QL Sample, Back Gate Structure

The magnetically doped TI quantum well film is 4QL $Cr_{0.22}(Bi_{0.22}Sb_{0.78})_{1.78}Te_3$, and the substrate 30 is STO substrate, in the embodiment 3.

Different back gate voltages ($V_b$) are applied to the magnetically doped TI quantum well film, and the corresponded Hall curves are tested at the temperature of 100 mK. FIG. 13 shows that the hysteresis phenomena can be seen, which means that the sample has a good ferromagnetic property. When $0V \leq V_b \leq 20V$, the change of $R_{AH}$ with $V_b$ is not very great. $R_{AH}$ is about 0.6 quantum resistance. When $V_b = 10$ V, $R_{AH}$ reaches the maximum value, $(R_{AH})_{max} = 0.59$ h·e$^{-2}$, which is about 15.3 kΩ. This value exceeds a half of quantum resistance and is larger than the greatest known anomalous Hall resistance ever achieved in the world at this time. FIG. 14 shows that the change of the $R_{xx}$ with the change of the $V_b$ is more obviously than the change of the $R_{yx}$ with the change of $V_b$ as shown in FIG. 13. Especially, when $V_b = 0V$, the anomalous Hall angle ($\alpha = R_{AH}/R_{xx}$) > 0.5. FIG. 15 shows that the Hall angle ($R_{yx}/R_{xx}$) increases first and then decreases with the increasing of the $V_b$.

Embodiment 4

T=90 mK, 5QL Sample, Back Gate Structure, $V_t = 0$

The magnetically doped TI quantum well film is 5QL $Cr_{0.15}(Bi_{0.1}Sb_{0.9})_{1.85}Te_3$, and the substrate 30 is STO substrate having a thickness of 0.25 millimeters, in the embodiment 4. Different back gate voltages ($V_b$) are applied to the magnetically doped TI quantum well film at the temperature of 90 mK. When $V_b = 30$ V, the maximum $R_{AH}$ is about 24.1 kΩ.

Embodiment 5

T=400 mK, 5QL Sample, Back Gate Structure, $V_t$=0

The magnetically doped TI quantum well film is 5QL $Cr_{0.15}(Bi_{0.1}Sb_{0.9})_{1.85}Te_3$, and the substrate 30 is STO substrate having a thickness of 0.25 millimeters, in the embodiment 5. Different back gate voltages ($V_b$) are applied to the magnetically doped TI quantum well film at the temperature of 400 mK. When $V_b$=20 V, the maximum $R_{AH}$ is about 23.0 kΩ.

Embodiment 6

T=1.5 K, 5QL Sample, Back Gate Structure, $V_t$=0

The magnetically doped TI quantum well film is 5QL $Cr_{0.15}(Bi_{0.1}Sb_{0.9})_{1.85}Te_3$, and the substrate 30 is STO substrate having a thickness of 0.25 millimeters, in the embodiment 6. Different back gate voltages ($V_b$) are applied to the magnetically doped TI quantum well film at the temperature of 1.5 K. When $V_b$=28 V, the maximum $R_{AH}$ is about 19.02 kΩ.

The experiment results of the embodiments 1 to 6 are shown in the Table 1.

TABLE 1

| No. | Sample | Thickness | Temperature | $V_b$ (V) | $R_{AH}$ (kΩ) | Hall resistivity, $\rho_{yx}$ (μΩ·m) | $R_{xx}$ (kΩ) | $R_{AH}/R_{xx}$ |
|---|---|---|---|---|---|---|---|---|
| 1 | $Cr_{0.15}(Bi_{0.10}Sb_{0.9})_{1.85}Te_3$ | 5QL | 30 mK | −4.5 | 25.8 | 127.3 | 3.4 | 7.58 |
| 2 | $Cr_{0.22}(Bi_{0.22}Sb_{0.78})_{1.78}Te_3$ | 4QL | 1.5 K | 45 | 10 | 50 | 23.8 | 0.42 |
| 3 | $Cr_{0.22}(Bi_{0.22}Sb_{0.78})_{1.78}Te_3$ | 4QL | 100 mK | 10 | 15.3 | 76.5 | 34 | 0.45 |
| 4 | $Cr_{0.15}(Bi_{0.1}Sb_{0.9})_{1.85}Te_3$ | 5QL | 90 mK | 30 | 24.1k | 120 | 7 | 3.44 |
| 5 | $Cr_{0.15}(Bi_{0.10}Sb_{0.9})_{1.85}Te_3$ | 5QL | 400 mK | 20 | 23.0 | 115 | 13 | 1.7 |
| 6 | $Cr_{0.15}(Bi_{0.10}Sb_{0.9})_{1.85}Te_3$ | 5QL | 1.5 K | 28 | 19.02 | 95.1 | 18.88 | 1.0007 |

Comparative Examples

(1) $Sb_{2-y}Cr_yTe_3$

By changing the doping amount of Cr, the material of Cr doped $Sb_2Te_3$ TI quantum well film can be represented as $Sb_{2-y}Cr_yTe_3$. Four samples of 5QL $Sb_{2-y}Cr_yTe_3$ TI quantum well films are formed on the (111) surface of the STO substrate, wherein y is 0, 0.05, 0.09, and 0.14 respectively. The experiment results reveal that when y=0, $Sb_{2-y}Cr_yTe_3$ is $Sb_2Te_3$, and 5QL $Sb_2Te_3$ has a linear dispersion surface state, the Dirac point is located above the Fermi level ($E_F$) and at 65 meV. When doping Cr to the $Sb_2Te_3$, the location of the Dirac point moves from +75 meV when y=0.05 to +88 meV when y=0.14. The $E_F$ of all the four samples is not at a magnetically induced gap-opening.

Without Bi doping, the 5QL $Sb_{1.91}Cr_{0.09}Te_3$ TI quantum well films are tuned by using the back gate structure. FIG. 16 and FIG. 17 show that $R_{xx}$ always increases with the increasing of $V_b$, which is a typical hole type semiconductor behavior. Thus, it can be known that the tuning has no affection to the type of carriers. The carrier type does not change during the tuning step. During the tuning step, the mobility (μ) does not change, and bases on the equation $R_{xx}^{-1}xx=\sigma_{xx}=\mu n_{2D}e$, it shows that $n_{2D}$ decreases with the increasing of $V_b$ in FIG. 18. FIG. 16 is the Hall curves of the 5QL $Sb_{1.91}Cr_{0.09}Te_3$ at different $V_b$ when T=1.5 K. The voltage range of the $V_b$ is from about −210 V to about +210 V. The anomalous Hall resistance ($R_{AH}$) always increases with the increasing of $V_b$. When $V_b$=−210 V, $R_{AH}$=24.1Ω, and $n_{2D}$=3.4×10$^{14}$ cm$^{-2}$. When $V_b$=+210V, $R_{AH}$=40.8Ω, and $n_{2D}$=9.7×10$^{13}$ cm$^{-2}$. The relations between $R_{AH}$ and $n_{2D}$ to $V_b$ are shown in FIG. 18. It can be seen from the FIG. 18 that $R_{AH}$ increases with the decreasing of $n_{2D}$. This phenomenon is completely different from the traditional diluted magnetic semiconductors. In the diluted magnetic semiconductor, the larger the $n_{2D}$, the larger the $R_{AH}$. However, the $R_{AH}$ is still too low to achieve QAHE.

(2) $Bi_{1.78}Cr_{0.22}Se_3$

By changing the doping amount of Cr, the material of Cr doped $Bi_2Se_3$ TI quantum well film can be represented as $Bi_{2-y}Cr_ySe_3$. By selecting y=0.22, the thickness is 10 QL thickness, a sample of 10 QL $Bi_{1.78}Cr_{0.22}Se_3$ TI quantum well film is formed. Referring to FIG. 19, when T=1.5K, there is no hysteresis loop observed in the Hall effect experiment, which indicates that Cr doped $Bi_2Se_3$ is a paramagnetic material. Therefore, the Cr doped $Bi_2Se_3$ cannot have the QAHE.

(3) $Bi_{1.78}Cr_{0.22}Te_3$

By changing the doping amount of Cr, the material of Cr doped $Bi_2Te_3$ TI quantum well film can be represented as $Bi_{2-y}Cr_yTe_3$. By selecting y=0.22, the thickness is 10 QL thickness, a sample of 10 QL $Bi_{1.78}Cr_{0.22}Te_3$ TI quantum well film is formed. FIG. 20 shows that when T=25K, there is hysteresis loops observed in the Hall effect experiment, which indicates that Cr doped $Bi_2Se_3$ is a ferromagnetism material.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for generating quantum anomalous Hall effect, comprising:
    forming a magnetically doped topological insulator quantum well film in a range of 3 quintuple layer (QL) thickness to 5 QL thickness on an insulating substrate;
    applying an electric field to the magnetically doped topological insulator quantum well film,
    wherein the forming the magnetically doped topological insulator quantum well film comprises: doping a topological insulator quantum well film with a first element and a second element during the forming of the topological insulator quantum well film to form the magnetically doped topological insulator quantum well film, the doping of the topological insulator quantum well film with the first element and the second element respectively introducing hole type charge carriers and electron type charge carriers in the topological insulator quantum well film, to decrease the carrier density of the topological insulator quantum well film to be smaller than or equal to $1\times10^{13}$ cm$^{-2}$, one of the first element and the second element is a magnetic dopant to the topological insulator quantum well film.

2. The method of claim 1, wherein when the insulating substrate has a dielectric constant larger than 5000 at a temperature equal to or smaller than 10 Kelvin, and the electric field is applied only by a back gate structure.

3. The method of claim 1, wherein a material of the insulating substrate is strontium titanate.

4. The method of claim 1, wherein a material of the magnetically doped topological insulator quantum well film is represented by a chemical formula of $Cr_y(Bi_xSb_{1-x})_{2-y}Te_3$, wherein $0<x<1$, $0<y<2$, and values of x and y satisfies that an amount of hole type charge carriers introduced by a doping of Cr is substantially equal to an amount of electron type charge carriers introduced by a doping of Bi.

5. The method of claim 4, wherein $0.05<x<0.3$, $0<y<0.3$, and $1:2<x:y<2:1$.

6. The method of claim 5, wherein $2:3 \leq x:y \leq 25:22$.

7. The method of claim 1, wherein the magnetically doped topological insulator quantum well film is in 5 QL.

8. The method of claim 1, wherein when the quantum anomalous Hall effect is achieved, an anomalous quantum resistance of the magnetically doped topological insulator quantum well film is 25.8 k$\Omega$.

9. The method of claim 1, wherein the electric field is applied by a liquid top gate structure located on a surface of the magnetically doped topological insulator quantum well film.

10. The method of claim 1, wherein the electric field is applied by a back gate structure.

* * * * *